United States Patent [19]
Montove

[11] Patent Number: 5,454,094
[45] Date of Patent: Sep. 26, 1995

[54] METHOD AND APPARATUS FOR DETECTING MULTIPLE MATCHES IN A CONTENT ADDRESSABLE MEMORY

[75] Inventor: Robert K. Montove, Los Gatos, Calif.

[73] Assignee: HaL Computer Systems, Inc., Campbell, Calif.

[21] Appl. No.: 81,988

[22] Filed: Jun. 24, 1993

[51] Int. Cl.⁶ .......................... G06F 13/00; G11C 15/00; G11C 15/04
[52] U.S. Cl. ...................... 395/435; 365/49; 365/189.08; 364/DIG. 1; 395/421.06; 395/421.07
[58] Field of Search ................................. 395/425, 400; 365/49, 189.07, 189.08

[56] References Cited

U.S. PATENT DOCUMENTS

| | | | |
|---|---|---|---|
| 3,800,286 | 3/1974 | Brown et al. | 395/400 |
| 4,670,858 | 6/1987 | Almy | 365/49 |
| 4,831,586 | 5/1989 | Nakagawa et al. | 365/49 |
| 4,928,260 | 5/1990 | Chuang et al. | 365/49 |
| 5,329,405 | 7/1994 | Hou et al. | 395/800 |

*Primary Examiner*—Glenn Gossage
*Attorney, Agent, or Firm*—Albert C. Smith

[57] ABSTRACT

A circuit and method for detecting multiple matches or hits in a content addressable memory (CAM) are disclosed. The circuit includes a logarithmic index generator or encoder, and a converter which provides a unary signal to an attached random access memory (RAM) in order to protect the RAM from simultaneous multiple addressing attempts. The circuit also includes a plurality of inverters for inverting the unary signal, and generates a signal indicating the presence of multiple matches in the content addressable memory when corresponding digits of the inverted unary signal and an address signal are both asserted. The circuitry for generating the multiple match signal includes a plurality of AND gates coupled to output lines of the CAM, a plurality of line transistors, and a pull-up transistor coupled to a multiple match or hit line.

12 Claims, 2 Drawing Sheets

METHOD AND APPARATUS FOR DETECTING MULTIPLE MATCHES IN A CONTENT ADDRESSABLE MEMORY

CROSS-REFERENCE TO RELATED APPLICATIONS

Montoye, "Content Addressable Memory Cell", filed Jul. 16, 1992, Ser. No. 07/915,075, now abandoned.

BACKGROUND OF THE INVENTION

1. Field of the Invention

This invention relates to content addressable memories and, more particularly, to a circuit for detecting multiple matches in a content addressable memory.

2. Description of the Related Art

Content addressable memories (CAMs) compare a search word with a set of stored words. An indication of whether or not the search word matches the stored words is produced for each stored word. A distinguishing characteristic of a CAM is that each stored word is uniquely identified on the basis of the content of the word itself, rather than by its address within the memory array as in conventional digital memories.

A CAM includes an array of memory cells arranged in a matrix of rows and columns. Each memory cell stores a single bit of digital information. The bits stored in a row of memory elements constitute a stored word. During a match operation, a search word of input data is applied to all the rows, and an indication is produced for each row as to whether or not the search word matches the word stored therein.

One possible use for a CAM is to facilitate searches on a conventional indexed random access memory (RAM). The CAM stores a series of "tags" which represent address locations in the RAM. Match operations are performed on the CAM in order to find the locations of data stored in the RAM. When match data is presented to the CAM, the CAM responds with a "tag" representing the address location in RAM containing the desired data. This address location can then be fed to the RAM's address lines in order to access the data.

A problem may occur when there is a "multiple match", i.e. more than one row of the CAM tries to indicate a match with the match data. If the CAM lines are connected directly to the RAM's address lines, then a multiple match will cause more than one RAM address line to be asserted simultaneously. Some RAMs are incapable of responding properly when more than one line is asserted simultaneously. In addition, assertion of multiple address lines may even be destructive for some RAMs.

Consequently, when a CAM is to be used with a conventional RAM that is not suited to receive multiple matches, it is imperative that the RAM never see more than one asserted address line. It is also useful for the system to be alerted to the fact that a multiple match has occurred, so that appropriate action may be taken (such as treating the stored data as invalid, or rechecking the CAM contents).

SUMMARY OF THE INVENTION

In accordance with the present invention, there is provided a method and apparatus for detecting multiple matches in a CAM. The invention protects the attached RAM by ensuring that only one address line of the RAM is asserted at a time. It also provides a signal to alert the system that a multiple match has occurred.

In brief, the invention converts information from the CAM lines into a logarithm index. It then converts this logarithm index into a unary code in which only one digit is asserted, and sends the unary code to the address lines of the RAM. Since the unary code never has more than one asserted digit, the RAM is protected from any multiple matches generated by the CAM. As used herein, unary code refers to the conventional designation of a single digit value represented by a signal asserted on an associated one of several digit-value lines.

If the information on the CAM lines has only one asserted digit, then the unary code will be identical to the CAM output. If, however, the CAM has asserted more than one address line, then the unary code will differ from the CAM output and will be inaccurate. This situation is detected by producing an inverted unary code and ANDing each digit of the inverted unary code with the corresponding digit of the original CAM output. If the result contains any asserted digits, then there has been a multiple match. A signal is generated to inform the system of this condition so that the unary code sent to the RAM can be ignored.

DESCRIPTION OF THE PREFERRED EMBODIMENT

The Figures depict a preferred embodiment of the present invention for purposes of illustration only. One skilled in the art will readily recognize from the following discussion that alternative embodiments of the structures and methods illustrated herein may be employed without departing from the principles of the invention described herein.

Figure 1:
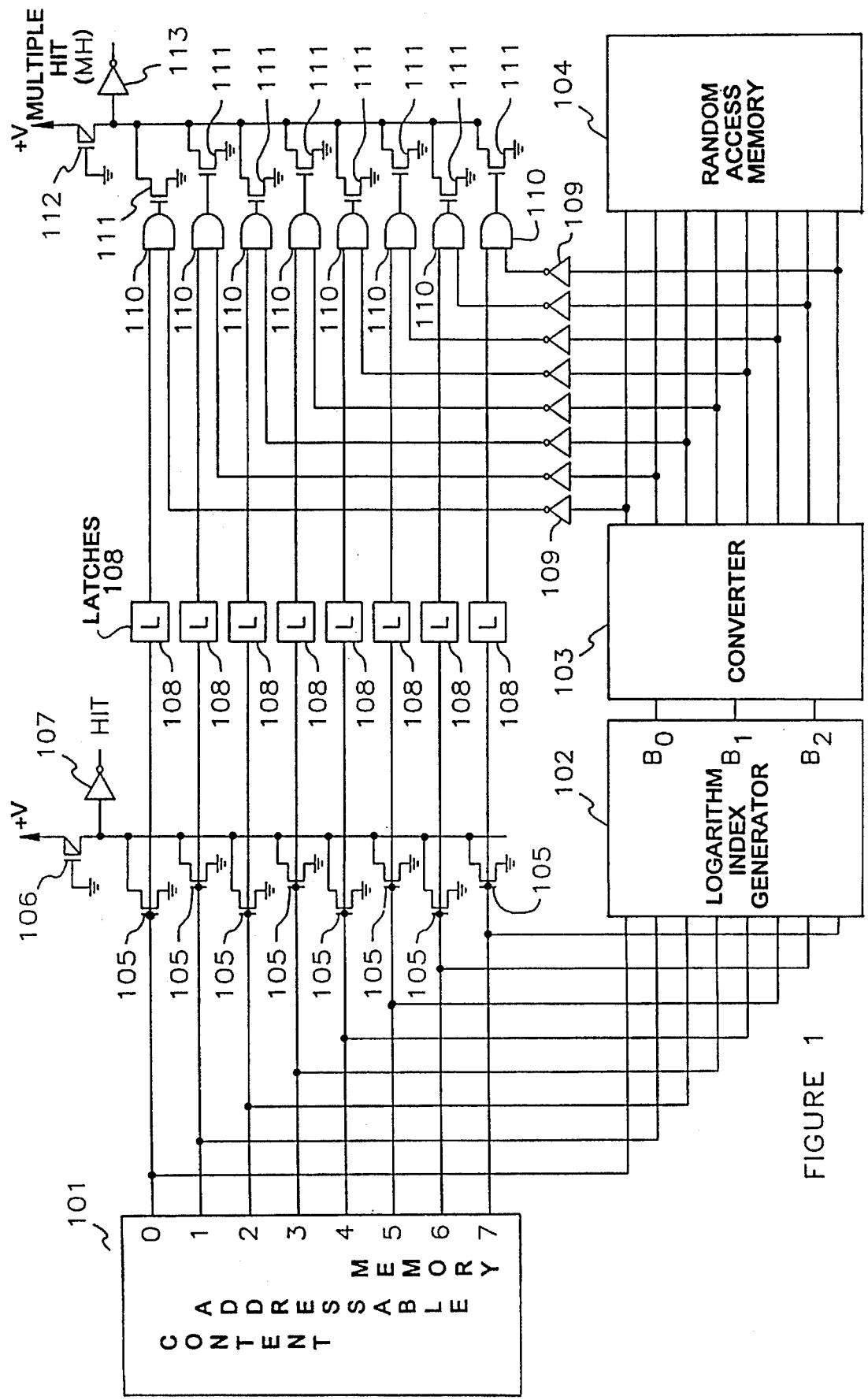
FIG. 1 is a diagram of a circuit for detecting multiple matches in a CAM, in accordance with the present invention.

Referring now to FIG. 1, there is shown a diagram of the preferred embodiment of the invention. Conventional CAM 101 is shown with eight output lines, labeled 0 through 7, although any number of output lines may be used. Each of these lines has two states. In the preferred embodiment the high state indicates assertion (or "1") and the low state indicates non-assertion (or "0").

The output lines are connected to logarithm index generator or encoder 102 which produces a logarithm index corresponding to the label of the CAM output line that is asserted. The logarithm index is carried on three lines labeled $B_0$, $B_1$, and $B_2$; in the general case there are $\log_2 n$ such log lines, where n is the number of CAM output lines.

Figure 2:
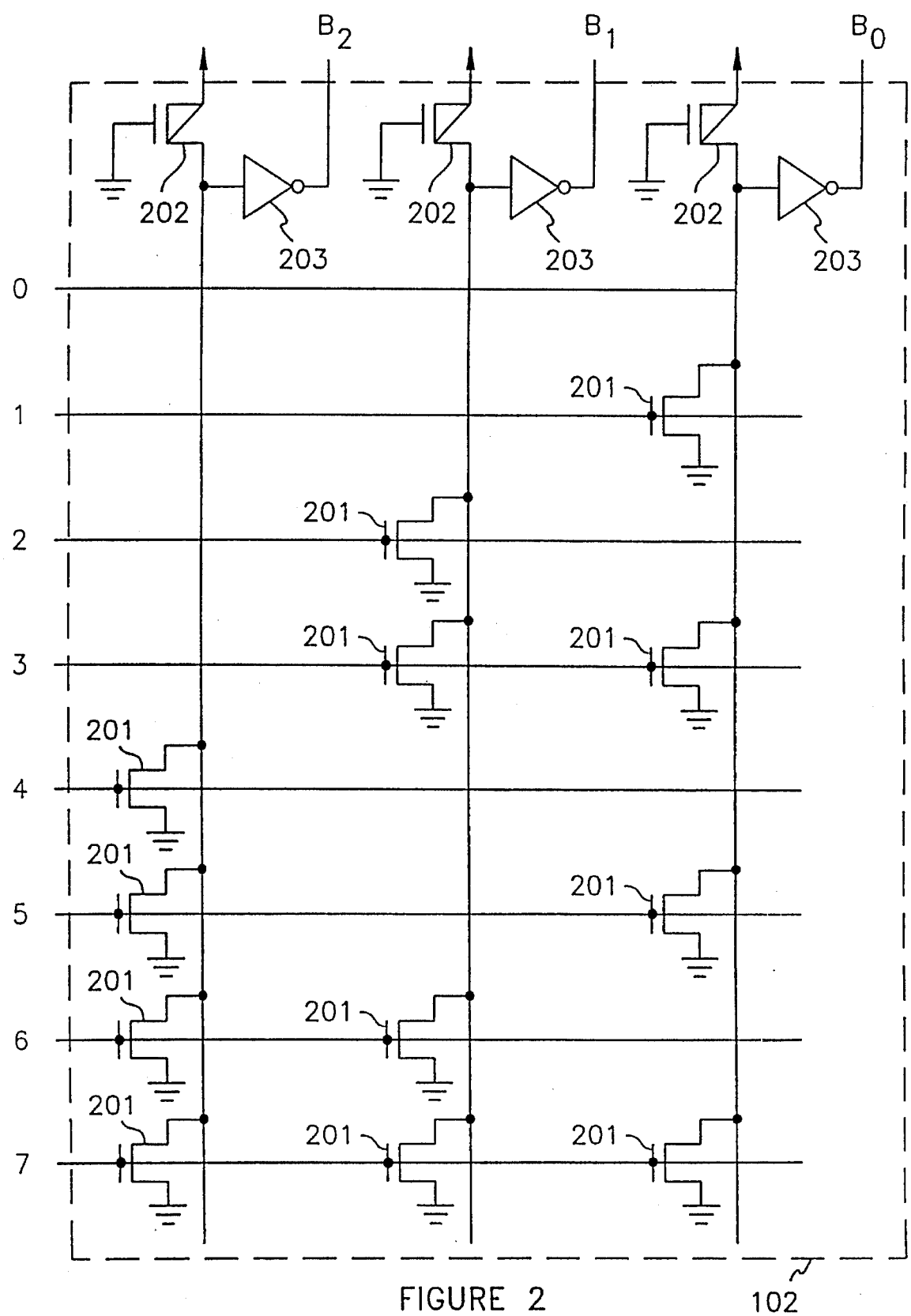
FIG. 2 is a diagram of one possible implementation of a logarithm index generator for use in the present invention.

Referring also to FIG. 2, there is shown the preferred embodiment for logarithm index generator 102 having eight input lines and three output lines (although any number n of input lines may be used, with $\log_2 n$ output lines). The input lines (connected to the CAM output lines) are labeled 0 through 7, and the output lines, passing through inverters 203, are labeled $B_0$, $B_1$, and $B_2$. Each of the output lines crosses each of the input lines, and at some of these crossings there is a transistor 201 with its gate connected to the input line, its drain connected to the output line, and its source connected to ground. Transistors 201 are placed only at selected crossings, arranged according to a conventional binary count: for the $B_0$ line every other input line has a connecting transistor 201; for the $B_1$ line, the arrangement is two-by-two; and for the $B_2$ line, the arrangement is four-by-four.

Pull-up transistor 202 and inverter 203 are connected to each output line. When no input lines are asserted, the output of inverters 203 (on lines $B_0$, $B_1$, and $B_2$) are low. When one input line is asserted, the output reads as a binary code equivalent to the label of the asserted input line. When more than one input line is asserted, the output reads as the result of an OR operation on the binary code equivalents of the asserted input lines.

The log lines are connected to converter 103, which converts the logarithm code into a unary code having the same number of digits as the number of CAM output lines. The design of such converter 103 is known to those skilled in the art. The unary code is transmitted to the address inputs of conventional RAM 104 via a plurality of conductors.

The CAM output lines are also connected to a match or hit detection circuit, for detecting and signalling the presence of at least one match or hit. Each CAM output line is connected to the gate terminal of an n-type transistor 105. The source terminals of all these transistors 105 are grounded, while the drain terminals are all connected together to the input of inverter 107 and to the drain terminal of pull-up p-type transistor 106. The source terminal of pull-up transistor 106 is connected to a power supply (not shown), and the gate terminal is grounded. Inverter 107 produces a signal called HIT, which goes high to indicate a "hit" whenever one of the CAM output lines is asserted.

The CAM output lines are also fed to a series of latches 108, and the output of each of these latches 108 is connected to the input of a corresponding AND gate 110. A series of inverters 109 inverts the unary code generated by converter 103 and feeds each digit of this inverted unary code to an input of a corresponding AND gate 110. The output of each AND gate 110 goes to the gate terminal of an n-type transistor 111. As with the hit detector transistors, each of these transistors 111 has a source terminal that is grounded, and all the drain terminals are connected together to the input of inverter 113 and to the drain terminal of pull-up transistor 112. The source terminal of pull-up transistor 112 is connected to a power supply (not shown), and the gate terminal is grounded. The transistors 111, pull-up transistor 112, and inverter 113 for a circuit to produce a multiple match signal in response to outputs of the AND gates 110. The output of inverter 113, designated MH, goes high to indicate multiple hits or matches on the CAM output lines. The latches 108, AND gates 110, transistors 111, pull-up transistor 112 and inverter 113 together form a circuit for generating the multiple match signal. The inverters 109 operate in conjunction with this circuit to form a circuit for determining and signalling that the unary code signal differs from the address code.

In general, the circuits operate as follows. When none of the CAM output lines is asserted, all of the gate terminals for transistors 105 are low. Thus, all of these transistors 105 are off. Pull-up transistor 106 pulls the input to inverter 107 high, which causes its output to be low. Therefore, HIT is low, indicating that no matches, or "hits", have occurred. Similarly, the input to latches 108 is low. Consequently, their outputs are low, as are the outputs of AND gates 110. Therefore, transistors 111 are all off, and pull-up transistor 112 causes MH to be low, indicating no multiple matches.

Now, if one of the CAM output lines is asserted, such as line 4 for example, the following occurs. The transistor 105 attached to line 4 turns on because its gate terminal is now high. This causes the drain terminal of that transistor to go low, pulling down the input to inverter 107. The input (line) to inverter 107 may be termed a match detection line. The output of inverter 107 goes high, informing the system that there has been a "hit". At the same time, the input to the latch 108 connected to line 4 goes high so that the asserted state of that line is remembered. The eight latches store the following code wherein line 4 is 1 and all the other digits are 0:

| Digit #: | 7 | 6 | 5 | 4 | 3 | 2 | 1 | 0 |
|---|---|---|---|---|---|---|---|---|
| Value: | 0 | 0 | 0 | 1 | 0 | 0 | 0 | 0 |

Meanwhile, logarithm index generator 102 produces a signal in response to the assertion of line 4. This signal is the binary representation of "4", i.e. "100". Therefore $B_2$ is high, while $B_1$ and $B_0$ are low. These lines are fed to converter 103 which converts the signal to an eight-digit unary code wherein the digit corresponding to "4" is asserted:

| Digit #: | 7 | 6 | 5 | 4 | 3 | 2 | 1 | 0 |
|---|---|---|---|---|---|---|---|---|
| Value: | 0 | 0 | 0 | 1 | 0 | 0 | 0 | 0 |

This code is sent to the RAM. Since only one CAM output line was asserted, this signal is identical to the CAM output signal.

The unary code is also sent through inverters 109, resulting in the code:

| Digit #: | 7 | 6 | 5 | 4 | 3 | 2 | 1 | 0 |
|---|---|---|---|---|---|---|---|---|
| Value: | 1 | 1 | 1 | 0 | 1 | 1 | 1 | 1 |

This is ANDed with the output of latches 108, and the result is:

| Digit #: | 7 | 6 | 5 | 4 | 3 | 2 | 1 | 0 |
|---|---|---|---|---|---|---|---|---|
| Value: | 0 | 0 | 0 | 0 | 0 | 0 | 0 | 0 |

Thus, all the gate terminals of transistors 111 are pulled low, and pull-up transistor 112 pulls the input to inverter 113 high. The signal MH at the output of inverter 113 is low, indicating no multiple match.

In the case where two CAM output lines are asserted, such as lines 5 and 6, the following occurs. The HIT signal is activated in the same way as before, and the code stored in latches 108 is:

| Digit #: | 7 | 6 | 5 | 4 | 3 | 2 | 1 | 0 |
|---|---|---|---|---|---|---|---|---|
| Value: | 0 | 1 | 1 | 0 | 0 | 0 | 0 | 0 |

The output of logarithm index generator 102 is the result of an OR operation of binary 5 ("101") and binary 6 ("110"), which is "111". This is sent to the converter 103, which converts "111" to a unary code. Since "111" represents binary 7, the unary code only has bit 7 asserted:

| Digit #: | 7 | 6 | 5 | 4 | 3 | 2 | 1 | 0 |
|---|---|---|---|---|---|---|---|---|
| Value: | 1 | 0 | 0 | 0 | 0 | 0 | 0 | 0 |

This is sent to RAM 104. Meanwhile, inverters 109 produce the code:

| Digit #: | 7 | 6 | 5 | 4 | 3 | 2 | 1 | 0 |
|---|---|---|---|---|---|---|---|---|
| Value: | 0 | 1 | 1 | 1 | 1 | 1 | 1 | 1 |

When this is ANDed with the output of latches 108, the result is:

| Digit #: | 7 | 6 | 5 | 4 | 3 | 2 | 1 | 0 |
|---|---|---|---|---|---|---|---|---|
| Value: | 0 | 1 | 1 | 0 | 0 | 0 | 0 | 0 |

Two of the transistors 111 are on, pulling the input to inverter 113, which input may be termed a multiple match line low. Therefore, MH is asserted, indicating and informing the system that there is a multiple match. The system can now act as is appropriate in response to the multiple match. In particular, RAM 104 may ignore the asserted signal on the hit line that erroneously designates the digit 7. Other actions may be taken, depending on the system involved.

From the above description, it will be apparent that the invention disclosed herein provides a novel and advantageous apparatus for detecting multiple matches in a content addressable memory. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A circuit for detecting, including multiple matches, matches in a content addressable memory (CAM) having a plurality of CAM output lines on which an address code may be represented, the circuit comprising:
   a logarithm index generator, having an input connected to the CAM output lines and an output, for generating a logarithm index from the address code on the CAM output lines;
   a converter connected to receive the logarithm index for converting the logarithm index into a unary code having a plurality of digits; and
   a circuit for determining and signaling that the unary code and the address code differ, said circuit including:
   inverting means connected to receive the unary code, for generating an inverted unary code having a plurality of digits; and
   a circuit for generating a multiple match signal indicating whether any of the digits of the address code and the corresponding digit of the inverted unary code are both asserted.

2. The circuit of claim 1, wherein the inverting means comprises a plurality of inverters, each having an input connected to receive a digit of the unary code, and an output coupled to said circuit for generating a multiple match signal.

3. The circuit of claim 2, wherein the circuit for generating a multiple match signal comprises:
   a plurality of AND gates, each having a first input connected to a corresponding one of the CAM output lines, a second input connected to the output of a corresponding one of the inverters, and an output; and
   means connected to produce the multiple match signal responsive to at least one of the outputs of the AND gates being asserted.

4. The circuit of claim 2, wherein the circuit circuitry connected for generating a multiple match signal comprises:
   a plurality of latches, each having an input connected to a corresponding one of the CAM output lines and an output;
   a plurality of AND gates, each having a first input connected to a corresponding one of the latches, a second input connected to the output of a corresponding one of the inverters, and an output; and
   means connected to produce the multiple match signal responsive to at least one of the outputs of the AND gates being asserted.

5. The circuit of claim 4, further comprising a detector circuit connected to the CAM output lines for detecting and signaling the presence of at least one match.

6. The circuit of claim 5, wherein:
   the detector circuit comprises:
   a first pull-up transistor;
   a plurality of first line transistors, each having a gate terminal connected to a corresponding one of the CAM output lines, a source terminal connected to ground, and a drain terminal; and
   a match detection line connected to the drain terminals of the first line transistors and to the first pull-up transistor, so that the first pull-up transistor pulls up the match detection line, each of the first line transistors pulling down the match detection line responsive to assertion of a corresponding CAM output line;
   and wherein the means connected to produce the multiple match signal comprises:
   a second pull-up transistor;
   a plurality of second line transistors, each having a gate terminal connected to the output of a corresponding one of the AND gates, a source terminal connected to ground, and a drain terminal; and
   a multiple match line connected to the second pull-up transistor and to the drain terminals of the second line transistors, so that the second pull-up transistor pulls up the multiple match line, each of the second line transistors pulling down the multiple match line responsive to the output of the corresponding AND gate being asserted.

7. The circuit of claim 6, further comprising a plurality of conductors for transmitting the unary code to a random access memory.

8. A method of detecting matches, including multiple matches, in a content addressable memory (CAM) having a plurality of CAM output lines on which an address code may be represented, the method comprising the steps of:

generating a logarithm index from the address code on the CAM output lines;

converting the logarithm index into a unary code having a plurality of digits; and determining and signaling the unary code and the output code attaining a selected logical relationship, said step of determining and signaling comprises the substeps of:

generating an inverted unary code having a plurality of digits from the unary code; and generating a multiple match signal indicating whether any of the digits of the address code and the corresponding digit of the inverted unary code are both asserted.

9. The method of claim 8, wherein the step of generating a multiple match signal comprises:

performing an AND operation on each CAM output line together with the corresponding digit of the inverted unary code; and activating the multiple match signal responsive to at least one of the AND operations producing an asserted output.

10. The method of claim 8, wherein the step of generating a multiple match signal comprises:

latching the signal on each CAM output line;

performing an AND operation on the contents of each latch together with the corresponding digit of the inverted unary code; and activating the multiple match signal responsive to at least one of the AND operations producing an asserted output.

11. The method of claim 10, further comprising the step of detecting and signaling the presence of at least one match.

12. The method of claim 11, further comprising the step of transmitting the unary code to a random access memory.

* * * * *

UNITED STATES PATENT AND TRADEMARK OFFICE
CERTIFICATE OF CORRECTION

PATENT NO. : 5,454,094
DATED : September 26, 1995
INVENTOR(S) : Robert K. Montoye It is certified that error appears in the above-indentified patent and that said Letters Patent is hereby corrected as shown below:

On title page, items [19] and [75], change inventor last name from

"Montove" to --Montoye--.

Signed and Sealed this

Second Day of January, 1996

Attest:

BRUCE LEHMAN

*Attesting Officer*     *Commissioner of Patents and Trademarks*